United States Patent [19]

Wu

[11] Patent Number: 5,070,330
[45] Date of Patent: Dec. 3, 1991

[54] KEYBOARD SCANNING MATRIX

[75] Inventor: Dennis Wu, Kao-Hsiung Hsien, Taiwan

[73] Assignee: Acer Incorporated, Japan

[21] Appl. No.: 417,526

[22] Filed: Oct. 5, 1989

Related U.S. Application Data

[63] Continuation-in-part of Ser. No. 296,485, Jan. 12, 1989, abandoned.

[51] Int. Cl.$^5$ .............................................. H03M 11/00
[52] U.S. Cl. ......................................... 341/26; 341/22; 341/27
[58] Field of Search ................... 341/26, 27, 22, 31; 340/825.79; 178/17 C; 380/21, 44, 46, 52

[56] References Cited

U.S. PATENT DOCUMENTS

| | | | |
|---|---|---|---|
| 3,990,070 | 11/1976 | Spence | 341/26 |
| 4,121,048 | 10/1978 | Dev Choudhury | 178/17 C |
| 4,188,626 | 2/1980 | Frantz et al. | 340/711 |
| 4,231,016 | 10/1980 | Ueda | 178/17 C |
| 4,405,917 | 9/1983 | Chai | 341/26 |
| 4,459,581 | 7/1984 | Wilson et al. | 341/26 |
| 4,667,181 | 5/1987 | Hastreiter | 341/26 |
| 4,922,248 | 5/1990 | Shiga | 341/26 |

FOREIGN PATENT DOCUMENTS

| | | |
|---|---|---|
| 3640432 | 9/1988 | Fed. Rep. of Germany . |
| 2605763 | 10/1986 | France . |

OTHER PUBLICATIONS

IBM Technical Disclosure Bulletin, vol. 27, No. 4A, Sep., 1984.

*Primary Examiner*—Palmer C. DeMeo
*Assistant Examiner*—Peter S. Weissman
*Attorney, Agent, or Firm*—Andrus, Sceales, Starke & Sawall

[57] ABSTRACT

A keyboard (2) has two transverse arrays of conductors (R0-R13, C0-C7) defining a number of rows and columns of cross-points at each of which a key is positioned whereby depression of a key causes the conductors at the corresponding cross-points to be electrically connected. A scanning device (1) connected to each of the conductors and adapted during a scanning operation to apply a high or low potential to all the conductors of the two arrays and subsequently sequentially to apply a potential of the opposite type to each conductor of one array and to monitor the potential of the conductors of the other array such that if the potential of a conductor of the other array changes, this indicates that the key at the corresponding cross-point is depressed. The scanning device is connected directly to each of the conductors of the arrays, and an indicating device (4,5) is connected between one of the row conductors and a power supply, the condition of the indicating device being determined in accordance with the potential on the row conductor. A diode (7,9) is connected between the row conductor (R10) and the indicating device (5) so that if a cross-point (17) connected to the row conductor is depressed at the same time as a cross-point (18) in an adjacent row and the same column, the condition of the indicating device will not change when the adjacent row is scanned.

3 Claims, 2 Drawing Sheets

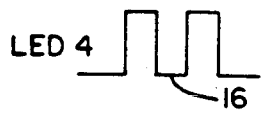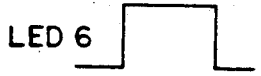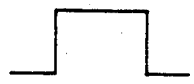
FIG. 2(A)  FIG. 2(B)  FIG. 2(C)
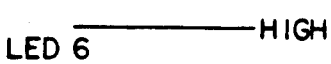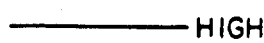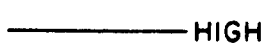
FIG. 3(A)  FIG. 3(B)  FIG. 3(C)
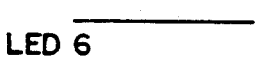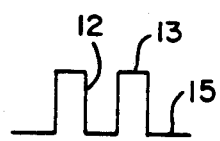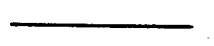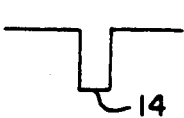
FIG. 4(A)  FIG. 4(B)  FIG. 4(C)

KEYBOARD SCANNING MATRIX

CROSS REFERENCE TO RELATED APPLICATION

The present application is a continuation-in-part application of U.S. patent application Ser. No. 07/296,485 filed Jan. 12, 1989 and now abandoned.

BACKGROUND OF THE INVENTION

The invention relates to a keyboard of the kind comprising two transverse arrays of conductors defining a number of rows and columns of cross-points at each of which a key is positioned whereby depression of a key causes the conductors at the corresponding cross-points to be electrically connected; and a scanning device connected to each of the conductors and adapted during a scanning operation to apply a high or low potential to all the conductors of the two arrays and subsequently sequentially to apply a potential of the opposite type to each conductor of one array and to monitor the potential of the conductors of the other array such that if the potential of a conductor of the other array changes, this indicates that the key at the corresponding cross-point is depressed, wherein the scanning device is connected directly to each of the conductors of the arrays, and wherein an indicating device is connected between one of the row conductors and a power supply, the condition of the indicating device being determined in accordance with the potential on the row conductor. Such keyboards are hereinafter referred to as of the kind described. It should be understood that the reference to rows and columns does not imply that these are necessarily orthogonal.

An example of a keyboard of the kind described is illustrated in DE-A-3640432.

In order to scan the keyboard, all the conductors are initially raised to a high potential and then each row conductor is pulsed in sequence at the low potential and the column conductors are simultaneously monitored to determine if any senses the change in potential in the row. If it does, this indicates that the key at the corresponding cross-point has been depressed.

The indicating device or devices which are used in keyboards of the kind described are activated by suitably setting the potential of the associated row conductor and are used to indicate conditions of the keyboard such as the scroll condition, number lock, capital (uppercase) lock and the like. During the scanning cycle, since the potential on the associated row conductor is changed, this will cause the condition of the indicating device to change also but only for a short time which is generally acceptable and will not be noticed in practice. However, a problem arises if two adjacent keys are inadvertently depressed simultaneously. In this case, if these are in the same column and adjacent rows, the condition of the indicating device will be changed not only during the scanning of the row to which the device is connected but also when the other row is scanned. This is undesirable.

SUMMARY OF THE INVENTION

In accordance with the present invention, a keyboard of the kind described is characterised in that a diode is connected between the row conductor and the indicating device so that if a cross-point connected to the row conductor is depressed at the same time as a cross-point in an adjacent row and the same column, the condition of the indicating device will not change when the adjacent row is scanned.

In operation, an indicating device which is normally on or off will be temporarily switched off or on respectively during the scanning operation but this change will last only for a very short time, typically a few microseconds, and will not be noticed by the user since it only occurs when the associated row itself is scanned.

BRIEF DESCRIPTION OF THE DRAWING

An example of a keyboard in accordance with the present invention will now be described with reference to the accompanying drawings, in which:

FIGS. 2A-2C, 3A-3C, and 4A-4C illustrate the conditions of the three LEDs of FIG. 1 during the scanning operation.

DESCRIPTION OF THE PREFERRED EMBODIMENT

Figure 1:
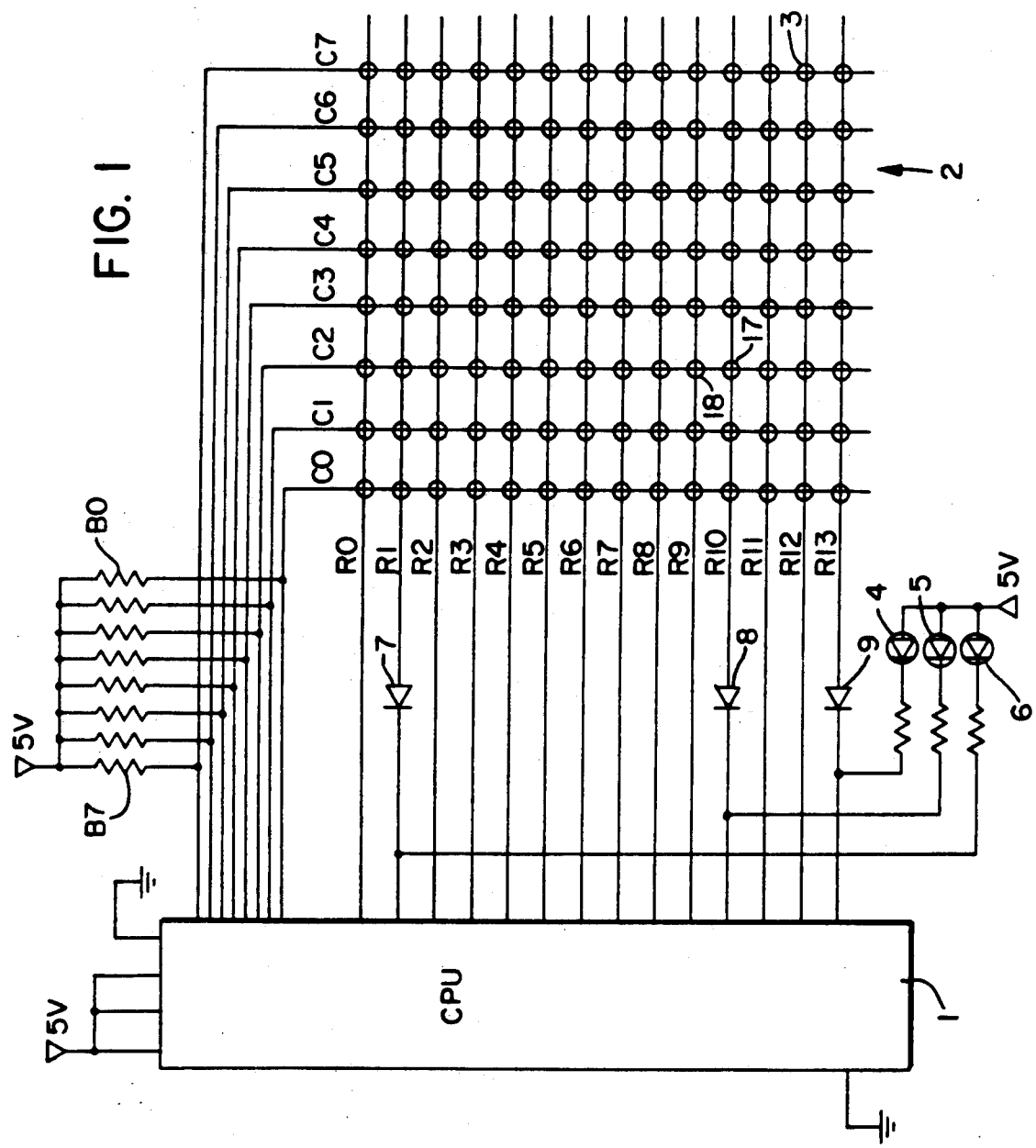
FIG. 1 is a schematic circuit diagram of the keyboard.

The keyboard shown in FIG. 1 comprises a CPU 1, for example an 8039, which has a total of 40 pins and is used to control all the electrical parts and signals of the keyboard. The CPU 1 is connected via lines B0-B7 to respective column conductors C0-C7 of a keyboard 2 and via respective ports to a set of row conductors R0-R13. The row conductors R0-R13 define a first conductor array which is positioned orthogonally beneath a second conductor array defined by the substantially parallel column conductors C0-C7. At the intersection between each pair of row and column conductors a cross-point is defined at which a key (not shown) is positioned. For example, a cross-point 3 is defined between row conductor R12 and column conductor C7.

Light emitting diodes (LEDs) 4-6 are connected to respective row conductors R1, R10, and R13 and to a common 5 volt source. The condition (on or off) of the light emitting diodes 4-6 is determined by the potential on the respective row conductor lines which in turn is controlled in a conventional manner by the CPU 1. Thus, if the potential on the row conductor line, and hence on the cathode of the LED, is high then the LED is off while if the potential is low then the LED is on. The LEDs 4-6 are used to indicate certain conditions of the keyboard such as the scroll condition, the numeral lock condition, and the capital lock condition respectively.

Diodes 7-9 are positioned in each of the three row conductors R1, R10, R13 respectively.

When the keyboard is used, keys associated with the cross-points are selectively depressed by an operator causing an electrical connection to be set up between the respective row and column conductors. The location of the depressed key is determined by the CPU 1 which carries out a regular scanning operation. In a scanning operation, all the conductors C0-C7 are raised to a high potential by the CPU 1 as are all the row conductors R0-R13. The CPU 1 then addresses each row in sequence starting with the row R0. The addressing of each row causes the potential on the row conductor to be pulled down to a low potential. If one of the keys in the row has been depressed then the change in potential in that row will be reflected by a corresponding change in the column conductor associated with the depressed key and this can be detected by the CPU 1 which monitors the potential in each of the column conductors. Since the CPU 1 knows which row conductor has been scanned and which column conductor has indicated a response, the cross-point corresponding to a depressed key can be determined. For example, if the key associated with the cross-point 3 is depressed, then when the row conductor R12 is scanned this will cause the potential on the row conductor R12 to be pulled low resulting in the potential on the column conductor C7 also being pulled low and this is detected by the CPU 1.

Typically, the depression of the key will cause a physical contact between the associated row and column conductors although it could be sufficient only to force the conductors into close proximity such that the change in potential in one causes a potential change in the other.

As has been mentioned above, if the operator activates one of the keyboard functions such as scroll and the like, this will be communicated to the CPU 1 via a key (not shown) and the CPU 1 will cause the potential on the row conductor associated with the LED which indicates that condition to be pulled low thus activating the corresponding LED. For example, the potential on the row conductor R10 could be pulled low thus activating the LED 5.

FIG. 4 illustrates the potential applied to the row conductors R1, R10, and R13 in a situation where the LED 5 is normally activated. FIG. 4A illustrates the situation when the row conductor R1 is scanned. As can be seen in FIG. 4A, the potential of row conductors R1 and R13 is initially high (since the LEDs 4, 6 are non-activated) while the potential on the row conductor R10 is low. At the beginning of the scanning cycle the potentials on all the row conductors are pulled high causing a change in the condition of the LED 5 indicated at 10 in FIG. 4A. The potential on each row conductor R0–R13 is then pulled low in sequence and FIG. 4A illustrates (not to scale) the time during which the potential on the row conductor R1 is pulled low as indicated at 11. During this time, the potential on the row conductors R10 and R13 remains high as shown in FIG. 4A.

When the CPU 1 has scanned row conductors R0-R9, it then pulls the potential on row conductor R10 low as indicated at 12 causing the LED 5 to turn on for a period during which the condition of the column conductors C0-C7 are monitored following which the potential on the row conductor R10 returns to a high level indicated at 13.

Scanning then continues through row conductors R11, R12 until row conductor R13 is reached and the potential on that conductor is then pulled low as indicated at 14 in FIG. 4C while the potentials on the other conductors remains high.

At the end of the scanning cycle the potentials on original row conductors R0–R13 return to their original conditions which is high in the case of all the conductors except for row conductor R10 which returns to a low condition as indicated at 15.

FIG. 2 illustrates the variation in potential on the row conductors R1, R10, and R13 respectively when all the LEDs 4–6 are normally activated. In this case, prior to scanning, the potential on each of the corresponding row conductors R1, R10, R13 is low. As illustrated in FIG. 2A, initially the potential on all the conductors is pulled high thus turning off all three LEDs 4–6. FIG. 4A illustrates the scanning of the row conductor R1 where the potential on that conductor is pulled low, as indicated at 16, thus momentarily turning the LED 4 on.

FIG. 2B illustrates the scanning of the row conductor R10 and FIG. 2C the scanning of the row conductor R13.

FIG. 3 is similar to FIG. 2 but illustrating the scanning of the row conductors R1 (FIG. 3A), R10 (FIG. 3B) and R13 (FIG. 3C) respectively when all three LEDs 4–6 are initially unactivated by virtue of a high potential being applied to the three corresponding row conductors.

Consider now the case where the keys corresponding to cross-points 17, 18 are simultaneously depressed. In the absence of the diode 8, the depression of the key 18 will cause the condition of the LED 5 to vary when the row conductor R9 is scanned. Thus, when the potential on the row conductor R9 is pulled low, this low condition will be communicated via the cross-points 18, 17 to the row conductor R10 and hence to the LED 5 which will turn on. However, by providing the diode 8, this is prevented and so the potential applied to the LED 5 will remain high while the row conductor R9 is scanned. This minimizes the time for which the LED 5 is turned on during a scan cycle to correspond only to the time during which the row conductor R10 is scanned. A similar situation arises with the row conductors R1, R13 by virtue of the provision of the diodes 7, 9.

I claim:

1. A keyboard comprising:
   a matrix of rows and columns of conductor lines which can be electrically interconnected by a corresponding key at each intersection of a row and a column;
   a scanning device having scan terminals coupled to the row conductor lines and sense terminals coupled to the column conductor lines, said scanning device being adapted to apply, during a scanning operation, a first potential of one polarity, from said terminals to all conductor lines, to subsequently, sequentially apply a second potential of the opposite polarity to the row conductor lines through said scan terminals, and to monitor the potential of column conductor lines through said sense terminals in order to determine whether a key is being depressed; and
   an indicating device connected to at least one of said scan terminals, said indicating device being responsive to the potential applied thereto for being placed in one operative state responsive to the application of the first potential from said scan terminal and in a second operative state responsive to said second potential from said scan terminal; and
   a diode interposed in the row conductor line coupled to said at least one scan terminal between the connection of said indicating device to said scan terminal and said matrix, said diode being poled to prevent the application of said second potential from said matrix to said indicating device for preventing alteration of the operative condition of said indicating device by a second potential so applied.

2. The keyboard according to claim 1 wherein said indicating device is an LED.

3. The keyboard according to claim 1 including a plurality of indicating devices and diodes, each of said indicating devices being connected to one of said scan terminals, said diodes being interposed in row conductor lines between the connections of said indicating devices to the respective scan terminals and said matrix.

* * * * *

UNITED STATES PATENT AND TRADEMARK OFFICE
CERTIFICATE OF CORRECTION

PATENT NO.    : 5,070,330

DATED         : December 3, 1991

INVENTOR(S)   : Dennis Wu

It is certified that error appears in the above-identified patent and that said Letters Patent is hereby corrected as shown below:

Col. 3, line 56, "original row" should be --all the row--

Signed and Sealed this

Third Day of August, 1993

Attest:

MICHAEL K. KIRK

*Attesting Officer*     Acting Commissioner of Patents and Trademarks